(12) United States Patent
Caldwell

(10) Patent No.: US 7,170,352 B1
(45) Date of Patent: Jan. 30, 2007

(54) APPARATUS AND METHOD FOR DYNAMIC TIME-DEPENDENT AMPLIFIER BIASING

(75) Inventor: Joshua William Caldwell, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 128 days.

(21) Appl. No.: 11/121,785

(22) Filed: May 4, 2005

(51) Int. Cl.
*H03F 3/45* (2006.01)

(52) U.S. Cl. .................. 330/261; 323/273; 323/274

(58) Field of Classification Search ............ 330/261, 330/129, 136; 323/273–274
See application file for complete search history.

(56) References Cited

U.S. PATENT DOCUMENTS

| | | | |
|---|---|---|---|
| 6,465,994 B1 * | 10/2002 | Xi | ................. 323/274 |
| 6,828,712 B2 | 12/2004 | Battaglin et al. | |
| 6,836,080 B2 | 12/2004 | Kazanov et al. | |
| 6,975,099 B2 * | 12/2005 | Wu et al. | ............ 323/280 |
| 6,977,491 B1 * | 12/2005 | Caldwell et al. | ............ 323/282 |
| 7,091,710 B2 * | 8/2006 | Yang et al. | ............ 323/282 |

* cited by examiner

*Primary Examiner*—Robert Pascal
*Assistant Examiner*—Hieu Nguyen
(74) *Attorney, Agent, or Firm*—Darby & Darby P.C.; Matthew M. Gaffney

(57) ABSTRACT

A circuit for driving a capacitive load is provided. The circuit includes a differential signal sensor and a differential amplifier. The differential amplifier is arranged to drive the capacitive load. Further, the differential amplifier is arranged to receive an output voltage at one input, and to receive a reference voltage at another input. The output voltage is provided at the output of the differential amplifier. Also, the differential amplifier is arranged to receive a bias current. The differential signal sensor is arranged to determine whether the difference between the output voltage and the reference voltage is within a voltage window. If the difference between the output voltage and the reference voltage is inside of the voltage window, the bias current is provided at its normal value. However, if the difference between the output voltage and the reference voltage is outside of the voltage window, the bias current is increased so that the bias current linearly increases with respect to time.

20 Claims, 11 Drawing Sheets

US 7,170,352 B1

APPARATUS AND METHOD FOR DYNAMIC TIME-DEPENDENT AMPLIFIER BIASING

FIELD OF THE INVENTION

The invention is related to amplifiers, and in particular, to an apparatus and method for dynamic, time-dependent amplifier biasing for driving heavy capacitive loads.

BACKGROUND OF THE INVENTION

A switching regulator may be configured to provide an output voltage in response to an input voltage. Typically, a switching regulator includes an indicator that is coupled to a switch. In operation, the inductor current is a triangle wave current based on the opening and closing of the switch, and an output capacitor provides the output voltage from the inductor current. Also, the switch is controlled by a control signal, where the duty cycle or the frequency of the control signal is typically modulated based on negative feedback.

Additionally, a diode-rectified switching regulator employs a diode to rectify the inductor current. In contrast, a synchronous switching regulator employs a synchronous switch rather than a diode. In a synchronous switching regulator, the inductor current can be positive or negative. Additionally, other topologies may be employed, such as a SEPIC topology or a CUK topology.

BRIEF DESCRIPTION OF THE DRAWINGS

Non-limiting and non-exhaustive embodiments of the present invention are described with reference to the following drawings, in which.

DETAILED DESCRIPTION

Figure 1:
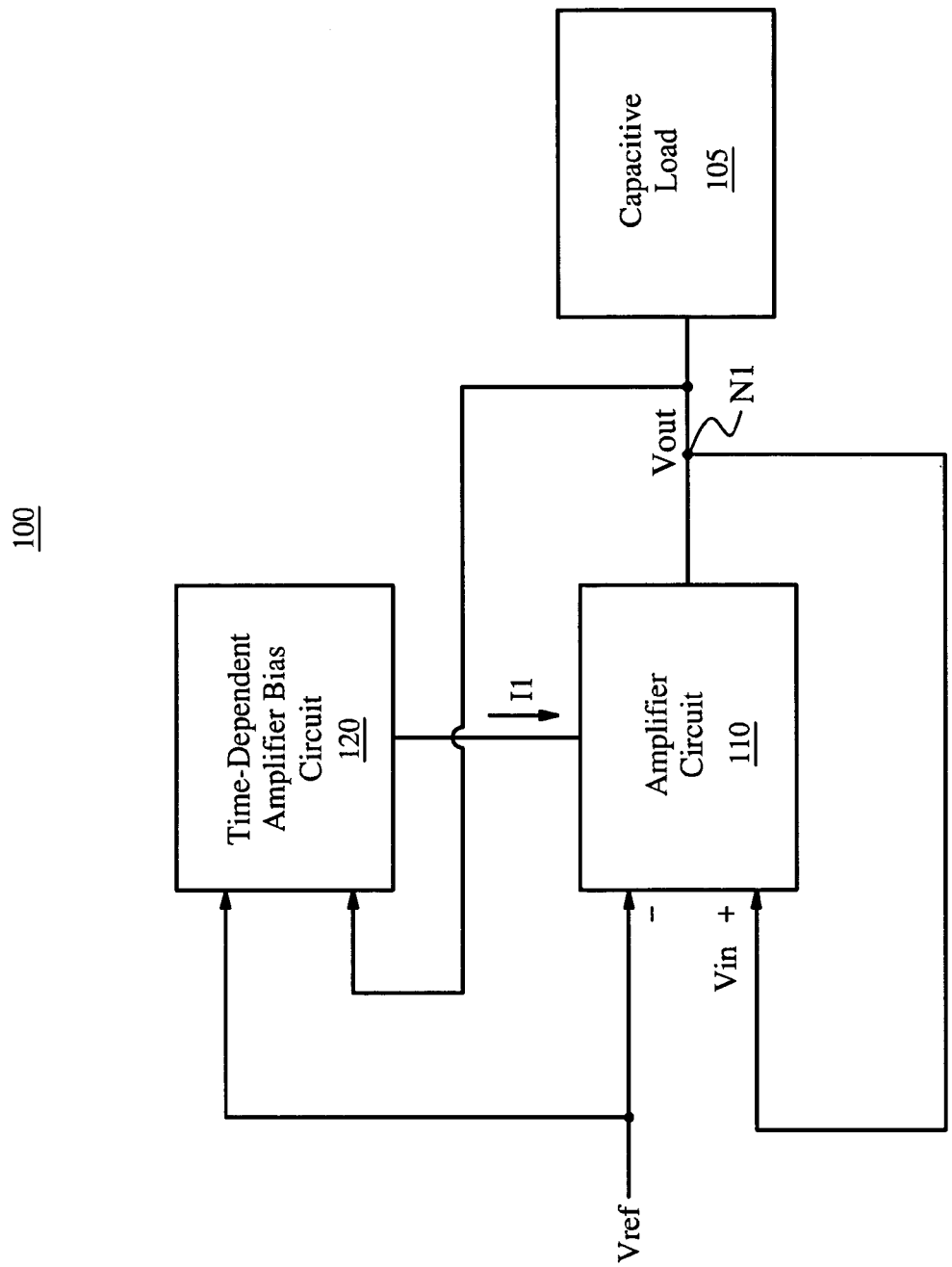
FIG. 1 illustrates a block diagram of a circuit for driving a capacitive load.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms make at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "an" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a circuit for driving a capacitive load. The circuit includes a differential signal sensor and a differential amplifier. The differential amplifier is arranged to drive the capacitive load. Further, the differential amplifier is arranged to receive an output voltage at one input, and to receive a reference voltage at another input. The output voltage is provided at the output of the differential amplifier. Also, the differential amplifier is arranged to receive a bias current. The differential signal sensor is arranged to determine whether the difference between the output voltage and the reference voltage is within a voltage window. If the difference between the output voltage and the reference voltage is inside of the voltage window, the bias current is provided at its normal value. However, if the difference between the output voltage and the reference voltage is outside of the voltage window, the bias current is increased. In one embodiment, the bias current is increased linearly with respect to the amount of time elapsed since the voltage difference exceeded the voltage window.

FIG. 1 illustrates a block diagram of circuit 100. Circuit 100 includes amplifier circuit 110, time-dependent amplifier bias circuit 120, and capacitive load 105.

In operation, amplifier circuit 110 receives differential input voltage Vin, and drives capacitive load 105 by providing an output signal at node N1 based, in part, on voltage VIN. In one embodiment, the output signal provided at N1 is a current which is provided to capacitive load 105, where output voltage Vout is provided at node N1 based, in part, on the load current and the capacitance of capacitive load 105. Differential input voltage VIN includes reference voltage Vref and output voltage Vout. Also, amplifier circuit 110 is arranged to receive bias current I1. In circuit 100, amplifier circuit 110 is arranged as a unity gain buffer. In other embodiment, amplifier 110 may be arranged in a different type of amplifier configuration.

In one embodiment, amplifier circuit 110 is arranged such that bias current I1 is a tail current of amplifier circuit 110. In another embodiment, amplifier circuit 110 is arranged such that bias current I1 is a bias current for an output stage of amplifier circuit 110.

Time-dependent bias circuit 120 is arranged to provide bias circuit 11 based, in part, on differential input signal Vin. Further, time-dependent bias circuit 120 is arranged such that, if differential input voltage Vin is within a voltage window, current I1 is provided at a pre-determined current value I. Also, time-dependent bias circuit 120 is arranged such that, if differential input voltage Vin outside a voltage window, current I1 is increased in a time-dependent manner. In one embodiment, if voltage Vin is outside of the voltage window, current I1 is increased linearly over time, so that current I1 is a current ramp. In other embodiments, current I1 is increased in a time-controlled manner other than a current ramp.

Circuit 100 may be used to drive heavy capacitive loads with a low current amplifier. By increasing current bias current I1 when voltages Vout and Vref are very different, and providing bias current I1 at a relatively low value otherwise, a low steady state quiescent current may be maintained with a large output drive current.

Additionally, circuit 100 may be employed to drive a large range of capacitances. In one embodiment, circuit 100 may be capable of operating with a change of 10,000× or more for the capacitance of capacitive load $C_{LOAD}$. Accordingly, for digital logic applications, circuit 100 may be capable of driving anywhere from 1 to 10,000 logic gates.

In one embodiment, circuit 100 is included in a regular circuit, such as a switching regulator, and capacitive load 105 is a soft-start capacitor current. One embodiment of such a regulator is described in greater detail below with reference to FIG. 10. However, the invention is not so limited, and circuit 100 may be used for other applications. For example, in one embodiment, the circuit may be used for driving a capacitive load with a square wave.

Figure 2:
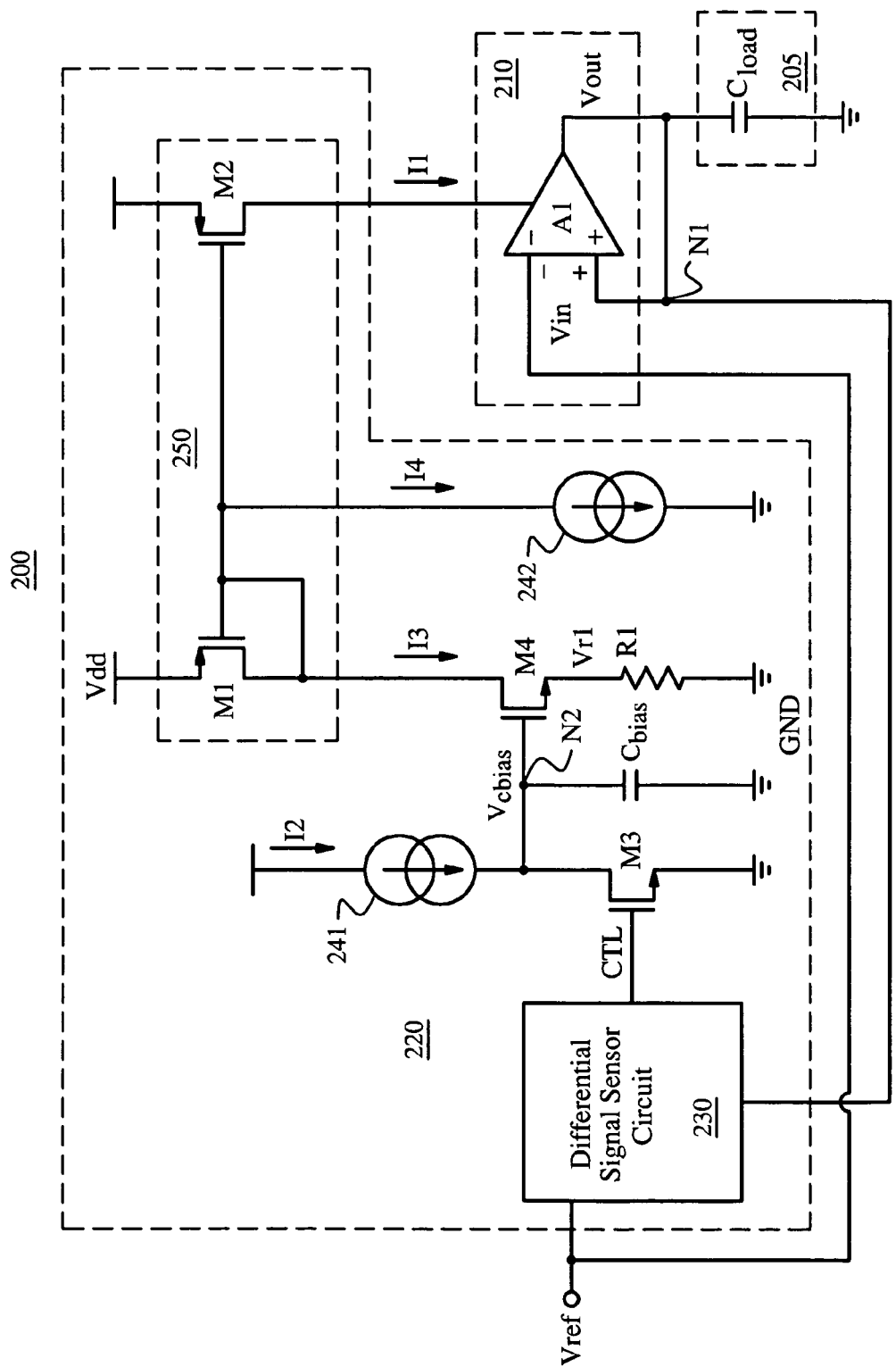
FIG. 2 shows a block diagram of an embodiment of the circuit of FIG. 1.

FIG. 2 shows a block diagram of an embodiment of circuit 200, which may be employed as an embodiment of circuit 100 of FIG. 1. Time-dependent amplifier bias circuit 220 includes differential signal sensor circuit 230, current source circuits 241 and 242, capacitor circuit Cbias, resistor $R_1$, and current mirror 250. Current mirror circuit 250 includes transistor M1 and M2. Also, amplifier circuit 210 includes op amp A1. Capacitive load 205 may include capacitor $C_{LOAD}$.

In operation, differential signal sensor circuit 230 provides control signal CTL based on whether voltage Vin is within a pre-determined voltage window. If voltage Vin is within the pre-determined voltage window, signal CTL is asserted. Otherwise, signal CTL is unasserted. In one embodiment, differential signal sensor circuit 230 is arranged to assert signal CTL if the absolute value of (Vout−Vref) is less than Vwindow, where Vwindow is roughly 20 mV.

Additionally, current source circuit 241 is arranged to provide current I2 to node N2. Also, transistor M3 is arranged to operate as a switch circuit that is closed if signal CTL is asserted, and open if signal CTL is unasserted.

Capacitor circuit $C_{BIAS}$ and transistor M3 are both coupled to node N2. Further, capacitor current $C_{BIAS}$ is arranged such that, if transistor M3 is open, capacitor circuit $C_{BIAS}$ receives current I2 so that capacitor voltage Vcbias linearly increases over time. Capacitor circuit $C_{BIAS}$ is further arranged such that if transistor M3 is closed, capacitor circuit $C_{BIAS}$ is discharged. If transistor M3 is closed, voltage Vcbias is approximately zero.

Additionally, transistor M4 is configured as a degenerated source follower with an input coupled to node N2 and an output coupled to resistor $R_1$ so that voltage Vr1 substantially tracks voltage Vcbias. If transistor M3 is closed, transistor M4 is shut off. Resistor $R_1$ is arranged to provide current I3 so that current I3 is substantially given by Vr1/$R_1$. Accordingly, if transistor M3 is closed, current I3 is approximately zero. However, if transistor M3 is open, current I3 linearly increases in magnitude.

Also, current source circuit 242 is arranged to provide current I4. In one embodiment, current mirror 250 is arranged to provide current I1 such that current I1 is substantially given by I3+I4. Accordingly, if transistor M3 is closed, current I1is substantially the same as current I4. However, if transistor M4 is open, current I1 linearly increases in magnitude.

Accordingly, when reference voltage Vref is very different from output voltage Vout, transistor M3 is turned off. This starts the charging of capacitor circuit Cbias with current I2. The bias current I1 into the amplifier is then, $$I1 = I4 + \left[\frac{(V_{CBIAS} - V_{gsA})}{R_1}\right] = I4 + \left[\frac{(V_{R1})}{R_1}\right] \quad \text{(Eqn. 1)}$$

The voltage across capacitor circuit CBIAS is, $$\Delta V_{CBIAS} = I2 \cdot \left(\frac{\Delta t}{C_{BIAS}}\right) = \Delta V_{R1} \quad \text{(Eqn. 2)}$$

where Δt is the amount of time elapsed since differential signal sensor circuit 230 turned transistor M3 off. The rate of change in current I3 is then, $$\frac{\Delta I_3}{\Delta t} = \left(\frac{I_2}{R_1 \cdot C_{BIAS}}\right) \quad \text{(Eqn. 3)}$$

Where bias current I1 is, $$I1 = \int \frac{I_2}{R_1 \cdot C_{BIAS}} dt + I_4 = \left(\frac{I_2}{R_1 \cdot C_{BIAS}}\right) \cdot t + I4 \quad \text{(Eqn. 4)}$$

The voltage across the charging capacitor $C_{LOAD}$ with the charging bias current is, $$\Delta Vout \approx \left(\frac{I_2}{R_1 \cdot C_{BIAS} \cdot C_{LOAD}}\right) \cdot t^2 + \left(\frac{I4}{C_{LOAD}}\right) \cdot t \quad \text{(Eqn. 5)}$$

The longer capacitor circuit $C_{LOAD}$ takes to charge, the more bias current is delivered to op amp A1. As transistor M4 saturates, no additional current is delivered. When the voltage across capacitor circuit $C_{LOAD}$ is within the pre-determined voltage window, differential signal sensor 230 asserts signal CTL, discharging capacitor circuit $C_{BIAS}$ and returning the amplifier bias to steady-state conditions.

Although a particular embodiment is explained and described for illustrative purposes with regard to FIG. 2, many alternative embodiments are within the scope and spirit of the invention. For example, although capacitor circuit Cbias and capacitor $C_{LOAD}$ are illustrated as a single capacitor, in other embodiments, a capacitor circuit may include tow or more capacitors coupled in series and/or in parallel to provide an equivalent capacitance. Also, although transistors M1–M4 are illustrated as MOSFETs in FIG. 2, one or more of transistors M1–M4 may be replaced with a type of transistor other than a MOSFET, such as a BJT, or the like. Further, resistor R1 may be replaced with a type of impedance circuit other than resistor R1, such as a transistor that is biased as resistive device. These and other variations are within the scope and spirit of the invention.

Figure 3:
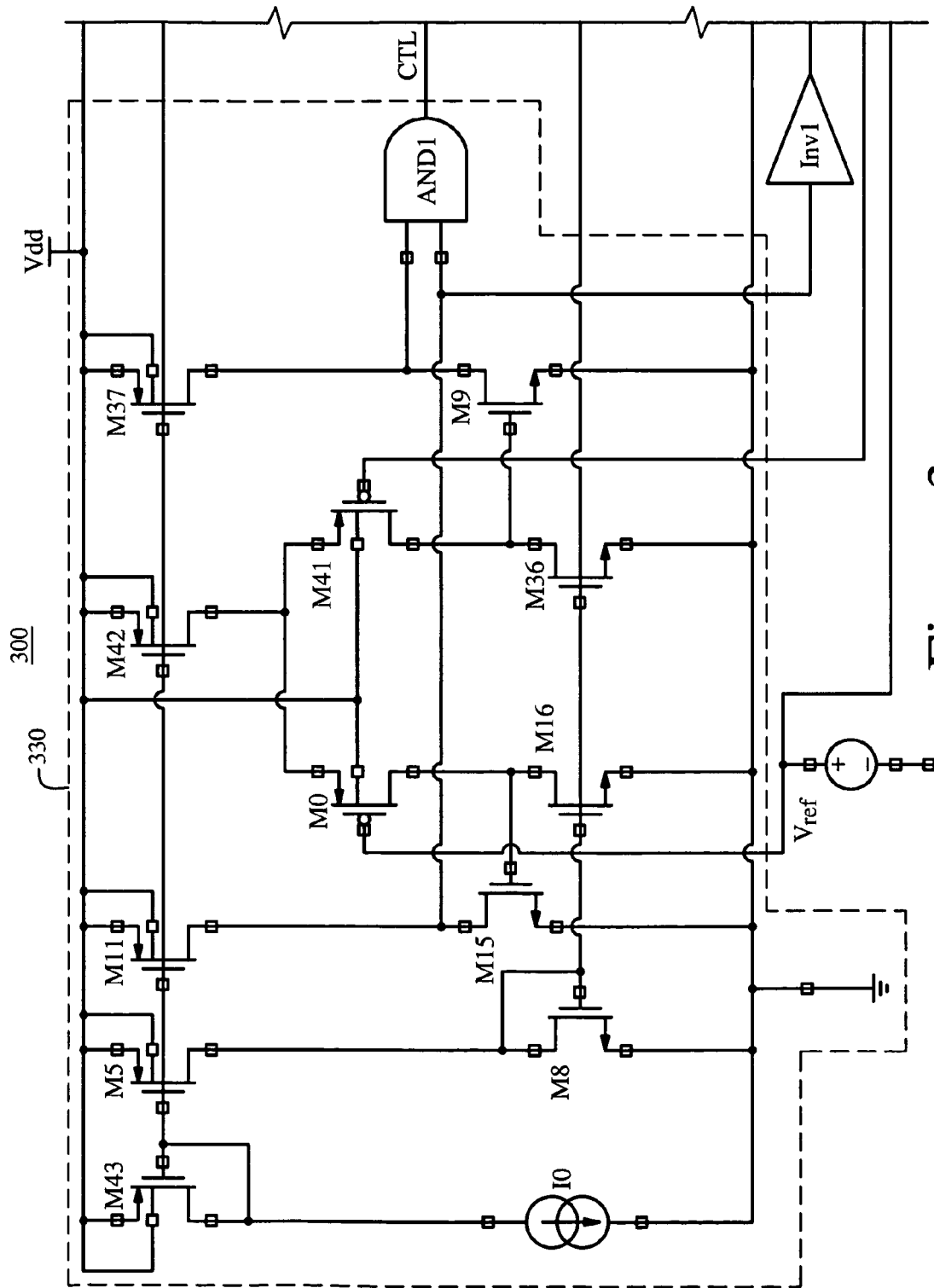
FIG. 3 schematically illustrates an embodiment of the circuit of FIG. 2.
Figure 3:
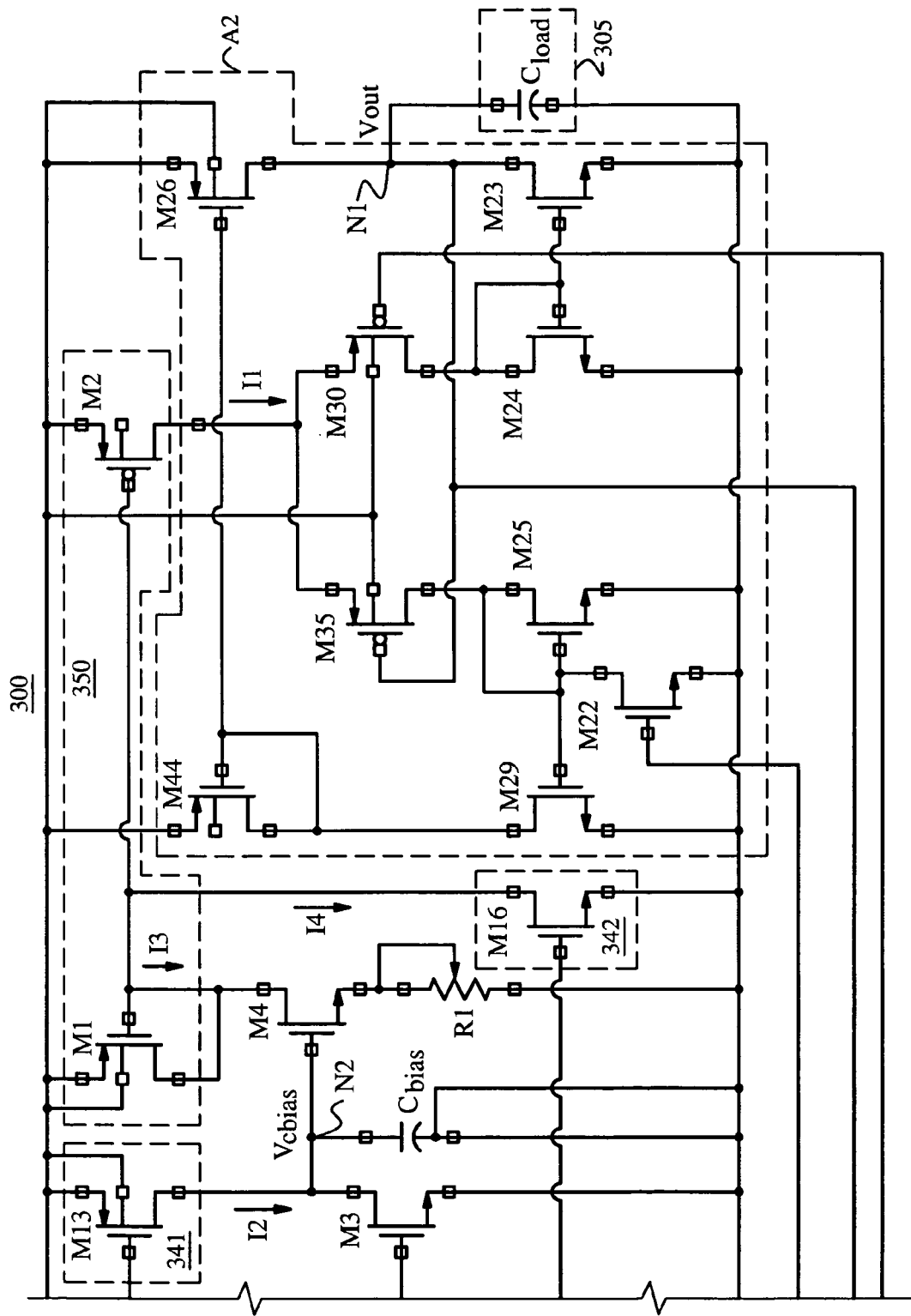

FIG. 3 schematically illustrates an embodiment circuit 300, which may be employed as an embodiment of circuit 200 of FIG. 2. In one embodiment, voltage Vwindow is based on the size ratio of transistor M6 to transistor M6.

Figure 4:
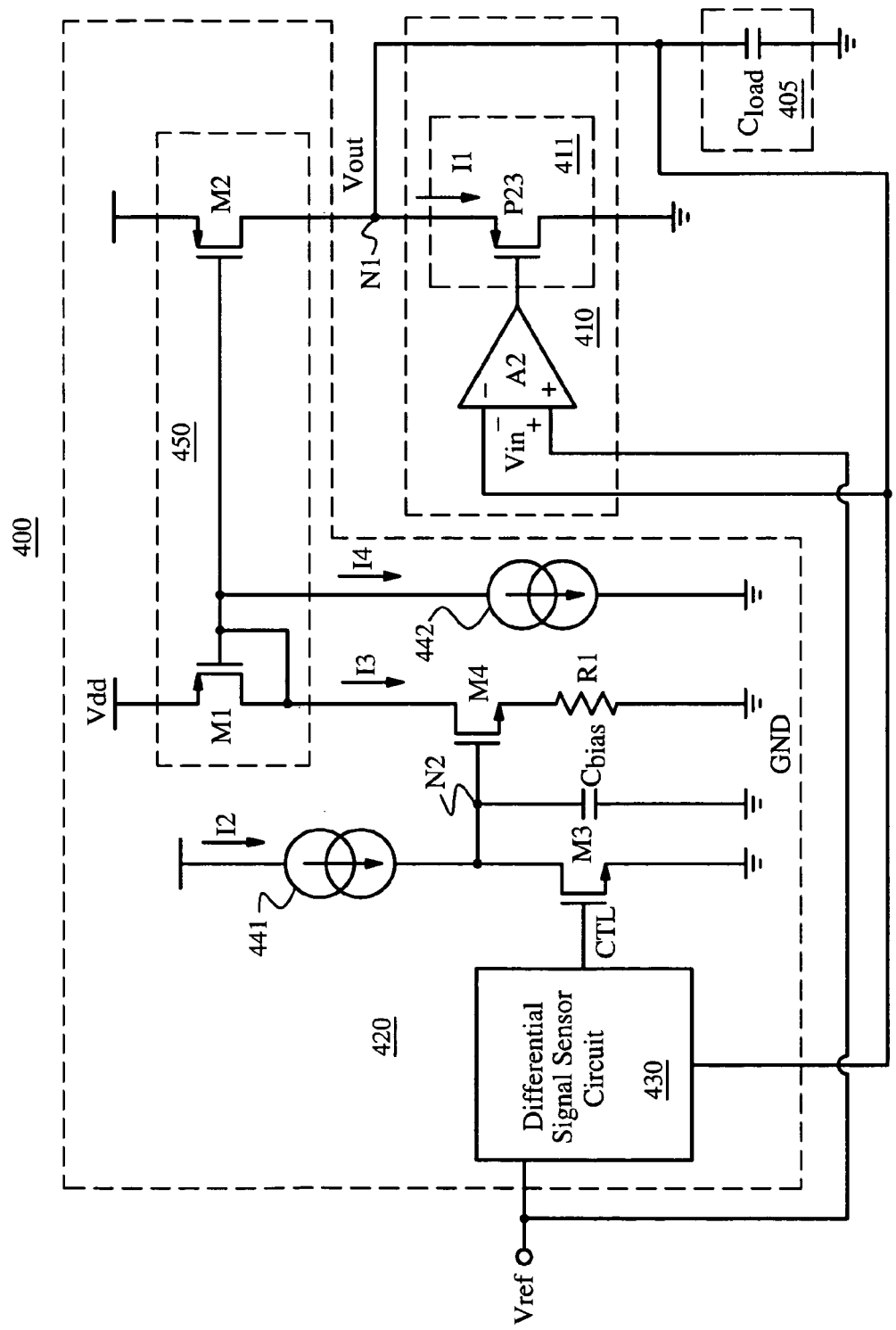
FIG. 4 shows a block diagram of an embodiment of the circuit of FIG. 1 in which the bias current is received by a p-type follower output stage.

FIG. 4 shows a block diagram of an embodiment of circuit 400, which may be employed as an embodiment of circuit 100 of FIG. 1. Amplifier circuit 410 includes amplifier A2 and output stage 411. Output stage 411 includes transistor P23.

Circuit 400 operates similarly to circuit 200 of FIG. 2 in most respects. However, in circuit 400, bias current I1 is a bias current for output stage 411 of amplifier circuit 410, rather than a tail current for the amplifier circuit.

Figure 5:
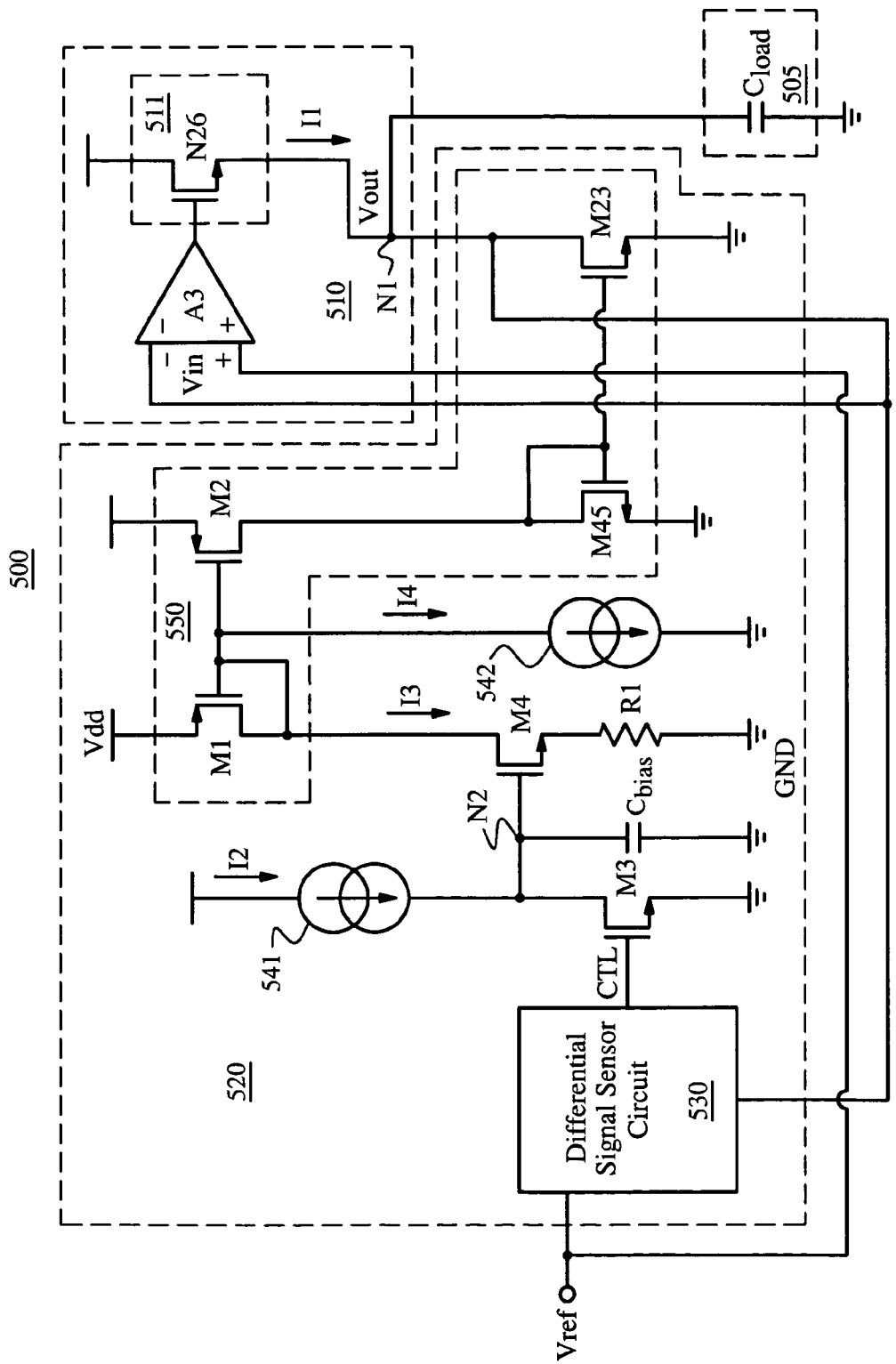
FIG. 5 illustrates a block diagram of an embodiment of the circuit of FIG. 1 in which the bias current is received by an n-type follower output stage.

FIG. 5 shows a block diagram of an embodiment of circuit 500, which may be employed as an embodiment of circuit 100 of FIG. 1. Components in circuit 500 may operate in a substantially similar manner to similarly-named components in circuit 400 in FIG. 4, albeit different in some ways. Output stage 511 includes transistor N26. Current mirror circuit 550 includes transistors M1, M2, M45, and M23.

Circuit 500 operates in a similar manner to circuit 400 of FIG. 4, except that output stage 511 is an n-type follower stage rather than a p-type follower output stage.

Figure 6:
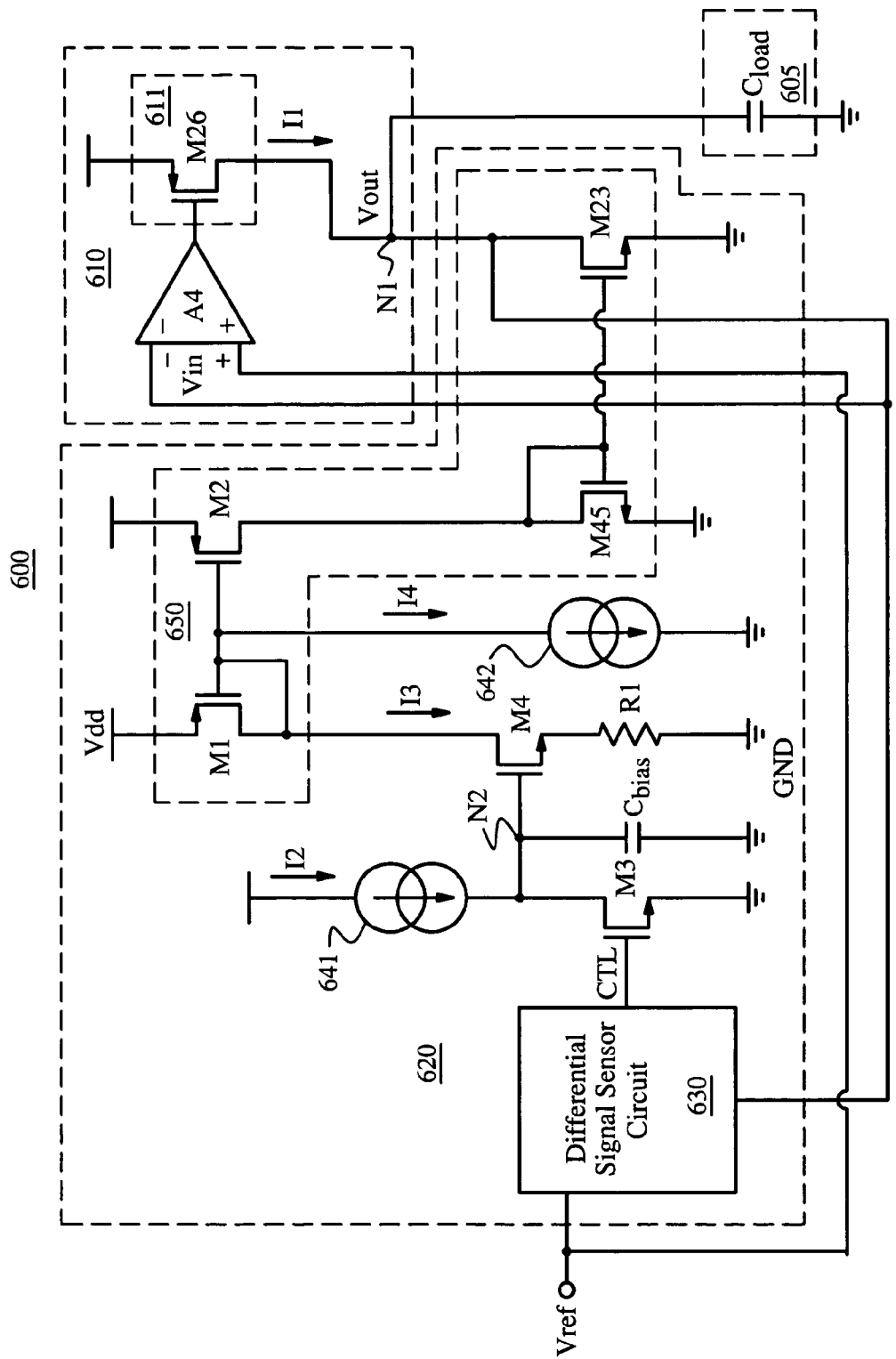
FIG. 6 shows a block diagram of an embodiment of the circuit of FIG. 1 in which the bias current is received by a p-type common source output stage.

FIG. 6 shows a block diagram of an embodiment of circuit 600, which may be employed as an embodiment of circuit 100 of FIG. 1. Components in circuit 500 may operate in a substantially similar manner to similarly-named components in circuit 500 in FIG. 5, albeit different in some ways. Output stage 611 includes transistor M26.

Circuit 600 operates in a similar manner to circuit 400 of FIG. 4, except that output stage 611 is a p-type common-source output stage rather than a p-type follower output stage.

Figure 7:
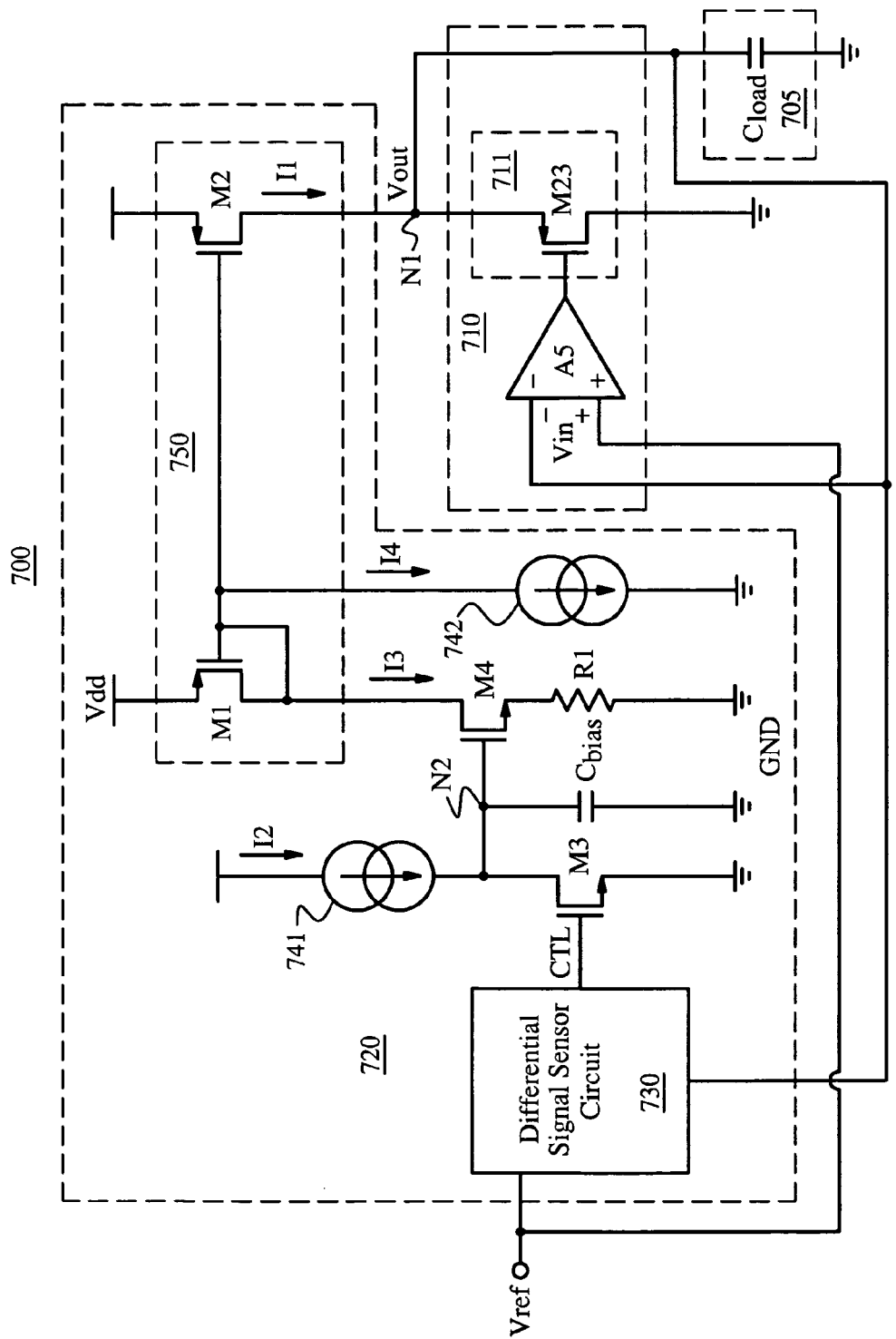
FIG. 7 illustrates a block diagram of an embodiment of the circuit of FIG. 1 in which the bias current is received by an n-type common source output stage.

FIG. 7 shows a block diagram of an embodiment of circuit 700, which may be employed as an embodiment of circuit 100 of FIG. 1. Components in circuit 700 may operate in a substantially similar manner to similarly-named components in circuit 400 in FIG. 4, albeit different in some ways. Output stage 711 includes transistor M23.

Circuit 700 operates in a similar manner to circuit 600 of FIG. 6, except that output stage 711 is an n-type common-source output stage rather than a p-type common- source output stage.

Figure 8:
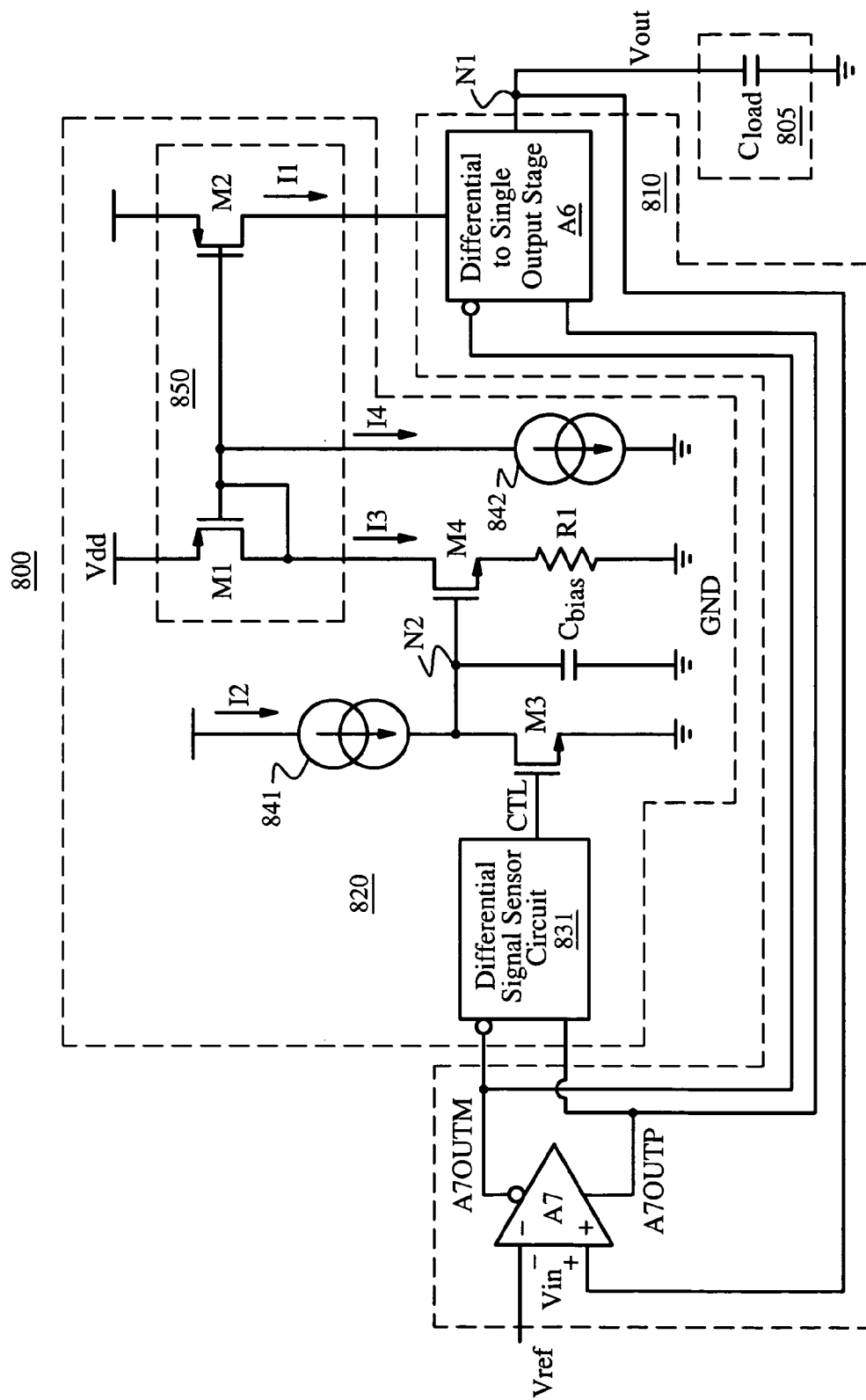
FIG. 8 shows a block diagram of an embodiment of the circuit of FIG. 1 in which the bias current is received as a tail current for a differential-to-single-ended output stage.

FIG. 8 shows a block diagram of an embodiment of circuit of 800, which may be employed as an embodiment of circuit 100 of FIG. 1. Components in circuit 200 may operate in a substantially similar manner to similarly-named components discussed in previous figures, albeit different in some ways. Amplifier circuit 810 includes differential amplifier A7 and differential-to-single output stage A6.

In operation, differential amplifier A7 provides differential output signal A7OUT, including signals A7OUTP and A7OUTM, based on differential input signal VIN. Differential amplifier A7 operates as a differential-to-differential input stage of amplifier circuit 810. Differential signal sensor circuit 831 is arranged to provide signal CTL based on whether differential input signal A7OUT is within a predetermined voltage window. Since signal A7OUT has already been gained up, differential signal sensor circuit 831 may employ a smaller voltage window than differential signal sensor circuit 231 of FIG. 2.

Differential-to-single output stage A6 is arranged to provide the output signal at node N1 based on differential voltage A7OUT. Further, differential-to-single output stage A6 is arranged to receive bias current I1 as a tail current.

Figure 9:
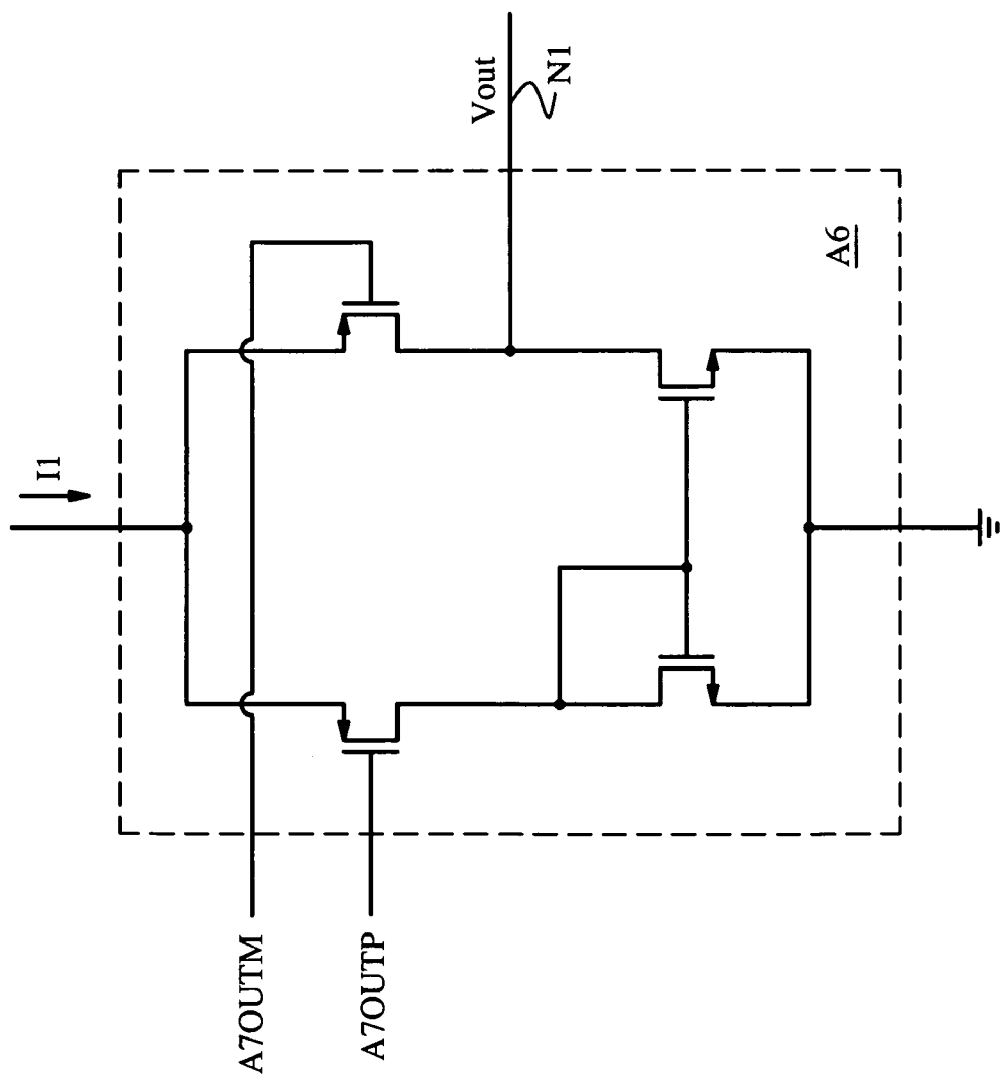
FIG. 9 schematically illustrates an embodiment of the differential-to-single output stage of FIG. 8.

FIG. 9 schematically illustrates an embodiment of differential-to-single output stage A6, which may be employed as an embodiment of differential-to-signal-ended output stage A6 of FIG. 8.

Figure 10:
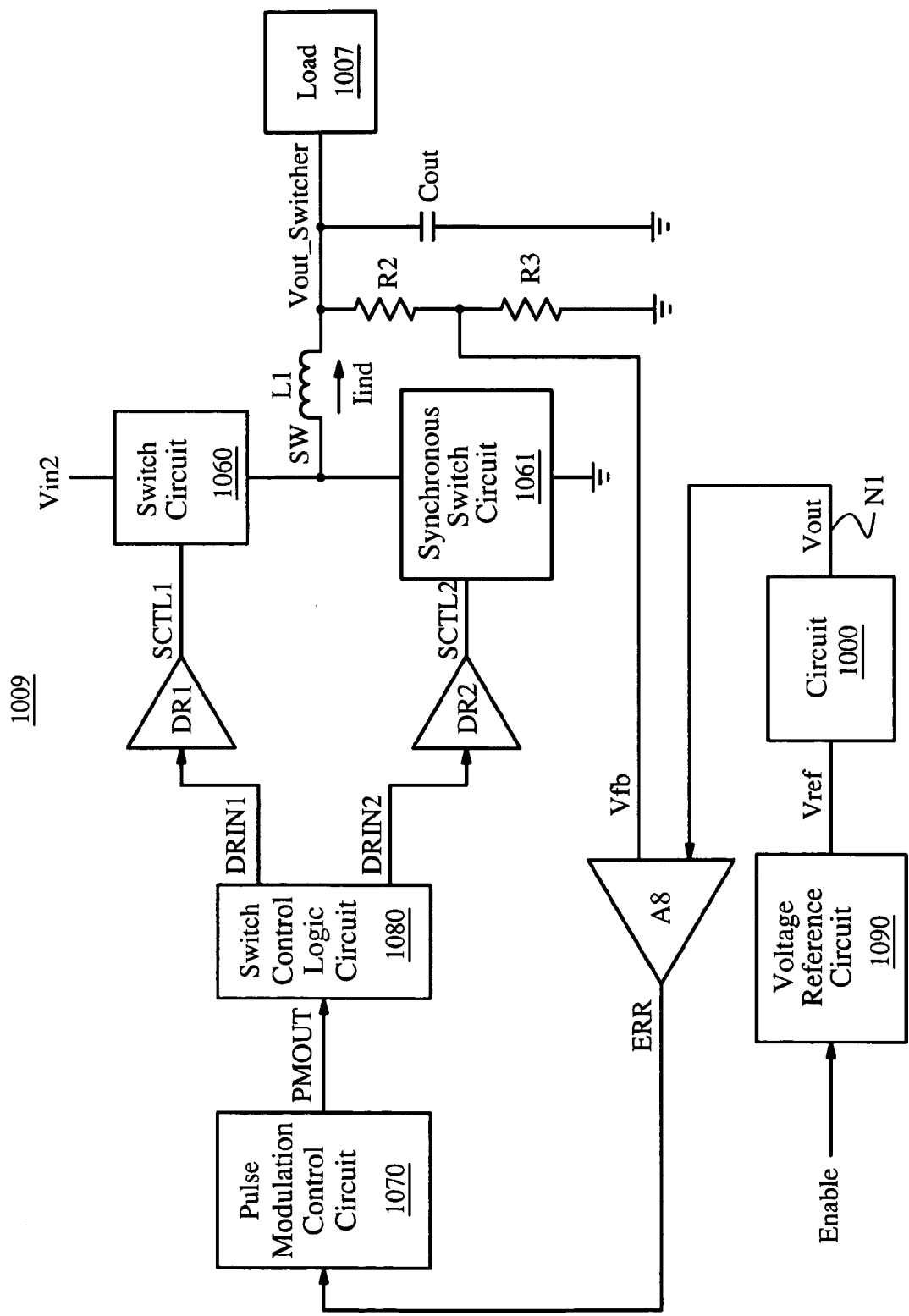
FIG. 10 shows a block diagram of an embodiment of a switching regulator circuit which employs an embodiment of the circuit of FIG. 1, arranged in accordance with aspects of the present invention.

FIG. 10 shows a block diagram of an embodiment of switching regulator circuit 1009. Switching regulator circuit 1009 includes switch circuit 1060, synchronous switch circuit 1061, inductor L1, pulse modulation control circuit 1070, switch control logic circuit 1080, output capacitor Cout, load 1007, error amplifier A8, circuit 1000, voltage reference circuit 1090, and resistors R1 and R2. Additionally, although not shown in FIG. 1, other elements such as a capacitor resistor network may be included between error signal ERR and feedback signal Vfb to control the frequency response of switching regulator circuit 1009.

In one embodiment, switching regulator circuit 1009 is arranged to provide regulated output voltage Vout_switcher from input voltage Vin2. Switch circuit 1060 is arranged to open and close based on switch control signal SCTL1. Similarly, in a synchronously-rectified embodiment, synchronous switch circuit 1061 is arranged to open and close based on synchronous switch control signal SCTL2. Inductor L1 may be arranged to provide inductor current Iind to output capacitor Cout such that output voltage Vout_switcher is provided.

Voltage reference circuit is arranged to provide voltage Vref. If signal Enable is unasserted, voltage Vref is approximately zero. Circuit 1000 is arranged to provide voltage Vout based, in part, on voltage Vref. Circuit 1000 includes an embodiment of circuit 100 of FIG. 1.

In one embodiment, resistors R2 and R3 are arranged as a voltage divider to provide feedback signal Vtb from output voltage Vout_switcher. Also, error amplifier A8 is arranged to provide error signal ERR from signals Vtb and Vref. In one embodiment, error amplifier A8 is arranged to provide signal ERR as a voltage, Verr. In another embodiment, error amplifier A8 is an operational transconductance amplifier (OTA) that is arranged to provide error signal ERR as a current, IERR. Pulse modulation circuit 120 is arranged to provide pulse modulation output signal PMOUT based on signal ERR.

Switch control logic circuit 1080 is arranged to provide signal DRIN1 from signal PMOUT. Also, in a synchronously-rectified embodiment, switch control logic circuit 1080 is further arranged to provide signal DRIN2 from signal PMOUT. Driver circuit DR1 is arranged to provide switch control signal SCTL1 from signal DRIN1. In a synchronously-rectified embodiment, switching regulator 100 includes driver circuit DR2, which is arranged to provide switch control signal SCTL2 from signal DRIN2.

Although switching regulator circuit 1009 illustrates one application for an embodiment of circuit 100 of FIG. 1, as previously discussed, the invention is not so limited, and embodiments of circuit 100 may be used for other applications.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for driving a capacitive load, comprising:
   an amplifier circuit that is arranged to provide an output signal to the capacitive load based, in part, on a voltage difference between an output voltage and another voltage, wherein the amplifier circuit is arranged to receive a first current; and wherein the output voltage is based, at least in part, on the output signal; and
   a time-dependent amplifier bias circuit that is arranged to provide the first current such that:
      if the voltage difference is inside of a pre-determined voltage window, the first current is substantially provided at a first predetermined level; and
      such that if the voltage difference is outside of the pre-determined voltage window, the first current is increased over time.

2. The circuit of claim 1, wherein
   the time-dependent amplifier bias circuit is arranged such that, if the voltage difference is outside of the pre-determined voltage window, the first current is increased linearly over time until at least one of the following occurs: a saturation value is reached, or the voltage difference is inside the pre-determined voltage window.

3. The circuit of claim 1, wherein the amplifier circuit is further arranged such that the first current is a trail current of the amplifier circuit.

4. The circuit of claim 1, wherein the amplifier circuit includes an output stage, and wherein the amplifier circuit is further arranged such that the first current is a bias current for the output stage.

5. The circuit of claim 1, wherein the time-dependent amplifier bias circuit includes:
   a differential signal sensor circuit that is arranged to provide a control signal such that the control signal is unasserted if the voltage difference exceeds a pre-determined voltage, and such that the control signal is asserted if the voltage difference does not exceed the pre-determined voltage.

6. The circuit of claim 5, wherein the differential signal sensor circuit includes:
   a tail current source;
   a differential pair that is coupled to the tail current source;
   a mismatched current mirror load that is coupled to the differential pair;
   a common source stage that is coupled to the current mirror load, wherein the common source stage includes a first output and a second output; and
   an AND gate having at least a first input, a second input, and an output, wherein the first input of the AND gate is coupled to the first output of the common source stage, the second input of the AND gate is coupled to the second output of the common source stage, and wherein the AND gate is arranged such that the control signal is provided at the output of the AND gate.

7. The circuit of claim 5, further comprising a switch circuit that is arranged to close is the control signal is asserted, and to open if the control signal is unasserted.

8. The circuit of claim 1, wherein the time-dependent amplifier bias circuit includes a capacitor circuit that is arranged to provide a capacitor voltage, and wherein the time-dependent amplifier bias circuit is arranged such that the capacitor circuit receives a second current if the control signal is unasserted, and such that the capacitor circuit discharges if the control signal is asserted.

9. The circuit of claim 8, wherein the time-dependent amplifier bias includes a follower circuit that has at least an output, and an input that is arranged to receive the capacitor voltage.

10. The circuit of claim 9, further including an impedance circuit that is coupled to the output of the follower circuit, wherein the impedance circuit is arranged to provide a second current if the control signal is unasserted.

11. The circuit of claim 10, wherein the time-dependent amplifier circuit further includes:
    another current source circuit that is arranged to provide another current; and
    a current mirror circuit that is arranged to provide the first current based, in part, on the second current and the other current.

12. A circuit for driving a capacitive load, comprising:
    a differential signal sensor circuit having at least an output;
    a switch circuit that is coupled to a node, wherein the switch circuit has at least a control input that is coupled to the output of the differential signal sensor circuit;
    a current source circuit that is coupled to the node;
    a capacitor circuit that is coupled to the node;
    a follower circuit having at least an input that is coupled to the node, and an output;
    an impedance circuit that is coupled to the output of the follower circuit;
    a current mirror circuit having at least an output, and an input that is coupled to the follower circuit;
    another current source circuit that is coupled to the current mirror circuit; and
    an amplifier circuit that is coupled to the output of the current mirror circuit.

13. The circuit of claim 12, wherein
    the amplifier circuit includes differential-to-differential stage and a differential-to-single output stage;
    the differential-to-single output stage is arranged to receive and amplifies bias current as a tail current;
    the differential-to-differential stage is arranged to provide a differential output signal based on a differential input voltage;
    a first half of the differential input voltage is a reference voltage;
    a second half of the differential input voltage is an output voltage that is based, at least in part, on an output signal;
    the differential signal sensor circuit is arranged to provide a switch control signal such that the switch control signal is unasserted if a difference between a first half of the differential output signal and a second half of the differential output signal exceeds a predetermined difference, and such that the switch control signal is asserted if the difference between the first half of the differential output signal and the second half of the differential output signal does not exceed the pre-determined difference;
    the differential-to-single output stage is arranged to receive the differential output signal, and further arranged to provide the output signal based on the differential output signal;
    the current source circuit is arranged to provide a second current to the node;
    the switch circuit is coupled between the node and ground;
    the switch circuit is arranged to close if the switch control signal is asserted, and to open if the switch control signal is unasserted;

the capacitor circuit is coupled between the node and ground; the impedance circuit is coupled between the output of the follower circuit and ground;

the impedance circuit is arranged to provide a third current based on a voltage of the node;

the other current source circuit is arranged to provide a fourth current; and wherein the current mirror circuit is arranged to provide the amplifier bias current at the output of the current mirror circuit based, in part, on the second current and the third current.

14. The circuit of claim 12, wherein the amplifier circuit is arranged to provide an output signal based on a differential input voltage, and further arranged to receive a first current;

a first half of the differential in put voltage is a reference voltage;

a second half of the differential input voltage is an output voltage that is based, at least in part, on the output signal;

the differential signal sensor circuit is arranged to provide a switch control signal such that the switch control signal is unasserted if a difference between the reference voltage and the output voltage exceeds a pre-determined voltage difference, and such that the switch control signal is asserted if the difference between the reference voltage and the output voltage does not exceed the pre-determined voltage difference;

the current source circuit is arranged to provide a second current to the node;

the switch circuit is coupled between the node and ground;

the switch circuit is arranged to close if the switch control circuit is asserted, and to open if the switch control signal is unasserted;

the capacitor circuit is coupled between the node and ground;

the impedance circuit is coupled between the output of the follower circuit and ground;

the impedance circuit is arranged to provide a third current based on a voltage of the node;

the other current source circuit is arranged to provide a fourth current; and wherein the current mirror circuit is arranged to provide the first current at the output of the current mirror circuit based, in part, on the third current and the fourth current.

15. The circuit of claim 14, wherein
the amplifier circuit is further arranged such that the first current is a tail current of the differential amplifier.

16. The circuit of claim 14, wherein
the amplifier circuit includes an output stage, and wherein the differential amplifier circuit is further arranged such that the first current is received by the output stage, wherein the output stage is at least one of: a follower output stage, a common source output stage, or a common emitter output stage.

17. A method for dynamic amplifier biasing, comprising:
driving a capacitive load based, in part, on a voltage difference between an output voltage and a reference voltage such that the capacitive load receives a load current that is based, at least in part, on an amplifier bias current, wherein the output voltage is based, at least in part, on the load current; and providing the bias current such that:
if the voltage difference is inside of a pre-determined voltage window, the amplifier bias current is substantially provided at a first-predetermined level; and
such that if the voltage difference is outside of the pre-determined voltage window, the amplifier bias current is increased over time.

18. The method of claim 17, wherein driving the capacitive load is accomplished with an amplifier circuit, and wherein the bias current is a tail current of the amplifier circuit.

19. The method of claim 17, wherein driving the capacitive load is accomplished with an amplifier circuit, the amplifier current includes an output stage, and wherein the bias current is a bias current of the output stage.

20. The method of claim 17, wherein providing the bias circuit includes:
determining whether the voltage difference is inside of the pre-determined voltage window;
if the voltage difference is inside of the pre-determined voltage window, closing a switch circuit;
if the voltage different is outside of the pre-determined voltage window, opening the switch circuit;
if the switch circuit is open:
providing a second current to a capacitor circuit; and
providing a third current based on a capacitor voltage that is associated with the capacitor circuit;
if the switch circuit is closed, discharging the capacitor circuit;
providing a fourth current; and
providing the amplifier bias current such that the first current is substantially equal to the third current plus the fourth current.

* * * * *

UNITED STATES PATENT AND TRADEMARK OFFICE
CERTIFICATE OF CORRECTION

PATENT NO. : 7,170,352 B1
APPLICATION NO. : 11/121785
DATED : January 30, 2007
INVENTOR(S) : Joshua William Caldwell It is certified that error appears in the above-identified patent and that said Letters Patent is hereby corrected as shown below:

Column 1; Line 14; Delete "indicator" and insert -- inductor --, therefor.

Column 2; Line 7; Delete "make" and insert -- take --, therefor.

Column 2; Line 12; Delete ""an"" and insert -- "in" --, therefor.

Column 3; Line 2; Delete "11" and insert -- I1 --, therefor.

Column 3; Line 26; Delete "regular" and insert -- regulator --, therefor.

Column 3; Line 28; Delete "current." and insert -- circuit. --, therefor.

Column 3; Line 40; Delete "transistor" and insert -- transistors --, therefor.

Column 3; Line 50; Delete "than" and insert -- then --, therefor.

Column 3; Line 57; Delete "current" and insert -- circuit --, therefor.

Column 4; Line 10; Delete "I1is, and insert -- I1 is, --, therefor.

Column 4, Line 18-21; Delete " $I1 = I4 + \left[\frac{(V_{bus} - V_{ref})}{R_1}\right] = I4 + \left[\frac{(V_{R1})}{R_1}\right]$ " and insert -- $I1 = I4 + \left[\frac{(V_{bus} - V_{ref})}{R_1}\right] = I4 + \left[\frac{(V_{R1})}{R_1}\right]$ --, therefor.

Column 4; Line 44; Delete "charging" and insert -- changing --, therefor.

Column 4; Line 65; Delete "tow" and insert -- two --, therefor.

Column 5; Line 10; Delete "M6." and insert -- M36. --, therefor.

Column 6; Line 7; Delete "differential-to-signal-ended" and insert -- differential-to-single-ended --, therefor.

Column 6; Line 37 (Approx.); Delete "Vtb" and insert -- Vfb --, therefor.

Column 6; Line 39 (Approx.); Delete "Vtb" and insert -- Vfb --, therefor.

UNITED STATES PATENT AND TRADEMARK OFFICE
CERTIFICATE OF CORRECTION

| | | |
|---|---|---|
| PATENT NO. | : 7,170,352 B1 | |
| APPLICATION NO. | : 11/121785 | |
| DATED | : January 30, 2007 | |
| INVENTOR(S) | : Joshua William Caldwell | |

It is certified that error appears in the above-identified patent and that said Letters Patent is hereby corrected as shown below:

Column 6; Line 41 (Approx.); Delete "Verr." and insert -- $V_{ERR}$. --, therefor.

Column 7; Line 27; In Claim 3, delete "trail" and insert -- tail --, therefor.

Column 7; Line 59; In Claim 7, after "close" delete "is" and insert -- if --, therefor.

Column 8; Line 2; In Claim 9, after "bias" insert -- circuit --.

Column 8; Line 38; In Claim 13, delete "and amplifies" and insert -- an amplifier--, therefor.

Column 8; Line 51; In Claim 13, delete "predetermined" and insert -- pre-determined --, therefor.

Column 9; Line 16; In Claim 14, delete "in put" and insert -- input --, therefor.

Signed and Sealed this

Third Day of April, 2007

JON W. DUDAS
*Director of the United States Patent and Trademark Office*